(12) United States Patent
Fazli Yeknami et al.

(10) Patent No.: US 12,381,527 B2
(45) Date of Patent: Aug. 5, 2025

(54) CONTINUOUS TIME LINEAR EQUALIZATION (CTLE) FEEDBACK FOR TUNABLE DC GAIN AND MID-BAND CORRECTION

(71) Applicant: Samsung Display Co., Ltd., Yongin-si (KR)

(72) Inventors: Ali Fazli Yeknami, San Jose, CA (US); Anup P. Jose, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 593 days.

(21) Appl. No.: 17/725,392

(22) Filed: Apr. 20, 2022

(65) Prior Publication Data
US 2023/0268896 A1    Aug. 24, 2023

Related U.S. Application Data

(60) Provisional application No. 63/313,383, filed on Feb. 24, 2022.

(51) Int. Cl.
*H03F 3/45*  (2006.01)
*H04B 1/04*  (2006.01)

(52) U.S. Cl.
CPC ..... *H03F 3/45179* (2013.01); *H03F 3/45475* (2013.01); *H04B 1/0458* (2013.01); *H04B 2001/0433* (2013.01)

(58) Field of Classification Search
CPC ............. H03F 3/45179; H03F 3/45475; H03F 1/3211; H03F 2203/45424;
(Continued)

(56) References Cited

U.S. PATENT DOCUMENTS 6,583,671 B2   6/2003  Chatwin
6,828,857 B2   12/2004 Paillet et al.
(Continued)

FOREIGN PATENT DOCUMENTS

CN    107171646 A    9/2017

OTHER PUBLICATIONS

European Search Report for EP Application No. 23151803.6 dated Jul. 18. 2023, 8 pages.
(Continued)

*Primary Examiner* — Hieu P Nguyen
(74) *Attorney, Agent, or Firm* — Lewis Roca Rothgerber Christie LLP

(57) ABSTRACT

An analog front end (AFE) circuit including: a continuous time linear equalizer (CTLE) circuit; a transimpedance amplifier (TIA) connected to the CTLE circuit; and a feedback circuit including: a first transistor connected between a first output of the feedback circuit and a first node connected to a first current source; a second transistor connected between a second output of the feedback circuit and a second node connected to a second current source; and a first tunable resistor coupled between the first node and the second node, wherein: a first input of the feedback circuit is connected to a first output of the TIA; a second input of the feedback circuit is connected to a second output of the TIA; the second output of the feedback circuit is connected to a first input of the TIA.

20 Claims, 7 Drawing Sheets

(58) Field of Classification Search
CPC . H03F 2203/45521; H03F 2203/45526; H03F 1/083; H03F 3/45197; H03F 3/45659; H03F 2203/45522; H03F 3/45932; H03F 2203/45022; H04B 1/0458; H04B 2001/0433; H03G 1/0029; H03G 5/28; H04L 25/0272; H04L 25/03885; H04L 25/03878
USPC .................................................. 330/252–261
See application file for complete search history.

(56) References Cited

U.S. PATENT DOCUMENTS

| | | | |
|---|---|---|---|
| 8,031,094 B2 | 10/2011 | Hotelling et al. | |
| 8,509,629 B2 | 8/2013 | Zou et al. | |
| 8,773,199 B2 | 7/2014 | Wan | |
| 9,397,623 B1 | 7/2016 | Lacroix | |
| 9,419,573 B2 | 8/2016 | Brekelmans | |
| 9,590,579 B2 | 3/2017 | Carter et al. | |
| 10,075,141 B1 | 9/2018 | Nagulapalli et al. | |
| 10,224,887 B2 | 3/2019 | Frasch et al. | |
| 10,263,815 B1* | 4/2019 | Geary | H04L 25/03885 |
| 10,845,440 B2 | 11/2020 | Trakimas et al. | |
| 10,852,437 B2 | 12/2020 | Eken et al. | |
| 11,736,069 B2* | 8/2023 | Liu | H03F 1/14 |
| | | | 330/277 |
| 2006/0139192 A1 | 6/2006 | Morrow et al. | |
| 2011/0294448 A1 | 12/2011 | Vauhkonen | |
| 2011/0298644 A1 | 12/2011 | Ohba | |
| 2013/0207722 A1 | 8/2013 | Bulzacchelli et al. | |
| 2013/0257536 A1 | 10/2013 | Sharma et al. | |
| 2021/0049943 A1 | 2/2021 | Jose et al. | |
| 2021/0091740 A1 | 3/2021 | Lin | |
| 2021/0359883 A1 | 11/2021 | Delshadpour et al. | |

OTHER PUBLICATIONS

Kimura et al., "A 28 GB/s 560 mW Multi-Standard SerDes With Single-Stage Analog Front-End and 14-Tap Decision Feedback Equalizer in 28 nm CMOS," IEEE Journal of Solid-State Circuits, vol. 49, No. 12, Dec. 2014, pp. 3091-3103.

* cited by examiner

CONTINUOUS TIME LINEAR EQUALIZATION (CTLE) FEEDBACK FOR TUNABLE DC GAIN AND MID-BAND CORRECTION

CROSS-REFERENCE TO RELATED APPLICATION(S)

This application claims priority to and the benefit of U.S. Provisional Patent Application No. 63/313,383 filed on Feb. 24, 2022, the entire content of which is incorporated by reference herein.

FIELD

The present application generally relates to continuous time linear equalization (CTLE) feedback circuits, and more particularly to a CTLE feedback for tunable direct current (DC) gain and mid-band correction.

BACKGROUND

High speed serial links, often referred to as serializer/deserializer (SerDes), are used extensively as interfaces in electronic devices such as electronic displays. As increasing amounts of data are transmitted over such high-speed serial links (e.g., as result of increased display resolution, color depth, and/or refresh rates), the interface speed increases accordingly as well. With the increase in speed comes an increase in power and silicon area of a communication receiver of the interface.

The above information in the Background section is only for enhancement of understanding of the background of the technology and therefore it should not be construed as admission of existence or relevancy of the prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a continuous time linear equalization (CTLE) feedback for tunable DC gain and mid-band correction.

In one or more embodiments, an analog front end (AFE) circuit including: a continuous time linear equalizer (CTLE) circuit; a transimpedance amplifier (TIA) connected to the CTLE circuit; and a feedback circuit including: a first transistor connected between a first output of the feedback circuit and a first node connected to a first current source; a second transistor connected between a second output of the feedback circuit and a second node connected to a second current source; and a first tunable resistor coupled between the first node and the second node, wherein: a first input of the feedback circuit is connected to a first output of the TIA; a second input of the feedback circuit is connected to a second output of the TIA; the second output of the feedback circuit is connected to a first input of the TIA; and the first output of the feedback circuit is connected to a second input of the TIA.

In one or more embodiments, the first input of the feedback circuit is connected to a gate terminal of the first transistor through a second tunable resistor; the second input of the feedback circuit is connected to a gate terminal of the second transistor through a third tunable resistor; the first current source is connected between the first node and a ground; and the second current source is connected between the second node and the ground.

In one or more embodiments, the feedback circuit further includes: a first capacitor connected between the gate terminal of the first transistor and the ground; and a second capacitor connected between the gate terminal of the second transistor and the ground, wherein the second tunable resistor, the third tunable resistor, the first capacitor, and the second capacitor are configured to reduce a feedback factor of the AFE circuit at high frequencies to enhance maximum peaking.

In one or more embodiments, the first tunable resistor is between 500 ohm to 3K ohm, and the second tunable resistor and the third tunable resistor is between 500 ohm to 4K ohm. In one or more embodiments, the second tunable resistor and the third tunable resistor are configured to equalize wide-band frequency response of the AFE circuit. In one or more embodiments, the second tunable resistor and the third tunable resistor are configured to adjust mid-band frequency response of the AFE circuit by adjusting zero-location in a frequency response of the AFE circuit.

In one or more embodiments, the first tunable resistor is configured to adjust DC gain of the AFE circuit. In one or more embodiments, the second input of the TIA is connected to a first output of the CTLE circuit; the first input of the TIA is connected to a second output of the CTLE circuit; the first output of the TIA is connected to the first input of the TIA through a fourth tunable resistor; and the second output of the TIA is connected to the second input of the TIA through a fifth tunable resistor.

In one or more embodiments, the fourth tunable resistor and the fifth tunable resistor are configured to implement identical gain change over all frequencies; a third capacitor is connected between the first output of the TIA and a ground; and a fourth capacitor is connected between the second output of the TIA and the ground.

In one or more embodiments, the CTLE circuit includes: a third transistor connected between a first output of the CTLE circuit and a third node connected to a third current source; a fourth transistor connected between a second output of the CTLE circuit and a fourth node connected to a fourth current source; a tunable degeneration resistor coupled between the third node and the fourth node; a degeneration capacitor coupled between the third node and the fourth node, wherein: a gate terminal of the third transistor and a gate terminal of the fourth transistor are connected to a passive CTLE circuit; the first output of the CTLE circuit is connected to the first output of the feedback circuit and the second input of the TIA; and the second output of the CTLE circuit is connected to the second output of the feedback circuit and the first input of the TIA.

In one or more embodiments, the third current source is connected between the third node and a ground; and the fourth current source is connected between the fourth node and the ground. In one or more embodiments, gain and boost of the AFE circuit is controlled by tuning the tunable degeneration resistor and the degeneration capacitor. In one or more embodiments, the tunable degeneration resistor is configured to adjust low frequency DC gain of the AFE circuit by adjusting zero-location in a frequency response of the AFE circuit, and wherein the degeneration capacitor is configured to adjust high frequency gain of the AFE circuit.

In one or more embodiments, the AFE circuit further including: a fifth transistor connected between a power supply and the first output of the CTLE circuit; a sixth transistor connected between the power supply and the second output of the CTLE circuit; and a common-mode feedback (CMFB) circuit connected to gate terminals of the fifth transistor and the sixth transistor, wherein: an output terminal of the CMFB circuit is connected to the gate terminals of the fifth transistor and the sixth transistor, a first input terminal of the CMFB circuit is connected to the first output of the CTLE circuit; a second input terminal of the CMFB circuit is connected to the second output of the CTLE circuit; and a third input terminal of the CMFB circuit is connected to a reference voltage.

In one or more embodiments, an analog front end (AFE) circuit including: a transimpedance amplifier (TIA); and a feedback circuit including: a first transistor connected between a first output of the feedback circuit and a first node connected to a first current source; a second transistor connected between a second output of the feedback circuit and a second node connected to a second current source; and a first tunable resistor coupled between the first node and the second node, wherein: a first input of the feedback circuit is connected to a first output of the TIA; a second input of the feedback circuit is connected to a second output of the TIA; the second output of the feedback circuit is connected to a first input of the TIA; the first output of the feedback circuit is connected to a second input of the TIA; the first input of the feedback circuit is connected to a gate terminal of the first transistor through a second tunable resistor; the second input of the feedback circuit is connected to a gate terminal of the second transistor through a third tunable resistor; the first output of the TIA is connected to the first input of the TIA through a fourth tunable resistor; and the second output of the TIA is connected to the second input of the TIA through a fifth tunable resistor.

In one or more embodiments, the feedback circuit further includes: a first capacitor connected between the gate terminal of the first transistor and the ground; and a second capacitor connected between the gate terminal of the second transistor and the ground, wherein: the first current source is connected between the first node and a ground; the second current source is connected between the second node and the ground; and the second tunable resistor, the third tunable resistor, the first capacitor, and the second capacitor are configured to reduce a feedback factor of the AFE circuit at high frequencies to enhance maximum peaking.

In one or more embodiments, the AFE circuit further includes a continuous time linear equalizer (CTLE) circuit including: a third transistor connected between a first output of the CTLE circuit and a third node connected to a third current source; a fourth transistor connected between a second output of the CTLE circuit and a fourth node connected to a fourth current source; a tunable degeneration resistor coupled between the third node and the fourth node; a degeneration capacitor coupled between the third node and the fourth node, wherein: a gate terminal of the third transistor and a gate terminal of the fourth transistor are connected to a passive CTLE circuit; the first output of the CTLE circuit is connected to the first output of the feedback circuit and the second input of the TIA; the second output of the CTLE circuit is connected to the second output of the feedback circuit and the first input of the TIA; the third current source is connected between the third node and a ground; and the fourth current source is connected between the fourth node and the ground. In one or more embodiments, the second input of the TIA is connected to the first output of the CTLE circuit; the first input of the TIA is connected to the second output of the CTLE circuit; a third capacitor is connected between the first output of the TIA and a ground; and a fourth capacitor is connected between the second output of the TIA and the ground.

In one or more embodiments, the AFE circuit further including: a fifth transistor connected between a power supply and the first output of the CTLE circuit; a sixth transistor connected between the power supply and the second output of the CTLE circuit; and a common-mode feedback (CMFB) circuit connected to gate terminals of the fifth transistor and the sixth transistor, wherein: an output terminal of the CMFB circuit is connected to the gate terminals of the fifth transistor and the sixth transistor, a first input terminal of the CMFB circuit is connected to the first output of the CTLE circuit; a second input terminal of the CMFB circuit is connected to the second output of the CTLE circuit; and a third input terminal of the CMFB circuit is connected to a reference voltage.

In one or more embodiments, a system including: a continuous time linear equalizer (CTLE) circuit; a transimpedance amplifier (TIA) connected at an output of the CTLE circuit; and a feedback circuit including: a first transistor connected between a first output of the feedback circuit and a first node connected to a first current source; a second transistor connected between a second output of the feedback circuit and a second node connected to a second current source; and a first tunable resistor coupled between the first node and the second node, wherein: a first input of the feedback circuit is connected to a first output of the TIA; a second input of the feedback circuit is connected to a second output of the TIA; the second output of the feedback circuit is connected to a first input of the TIA; the first output of the feedback circuit is connected to a second input of the TIA; the first input of the feedback circuit is connected to a gate terminal of the first transistor through a second tunable resistor; and the second input of the feedback circuit is connected to a gate terminal of the second transistor through a third tunable resistor.

BRIEF DESCRIPTION OF THE DRAWINGS

These and other features of some example embodiments of the present disclosure will be appreciated and understood with reference to the specification, claims, and appended drawings, wherein:

Figure 1:
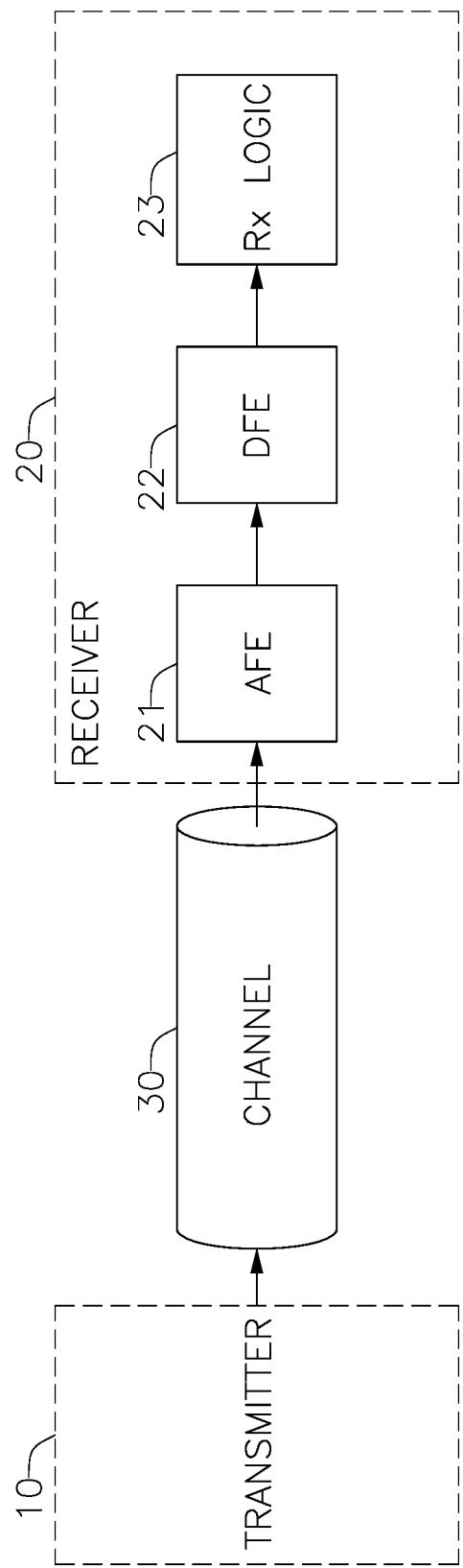
FIG. 1 illustrates a simple block diagram of a high speed communication system.

Aspects, features, and effects of embodiments of the present disclosure are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

The detailed description set forth below in connection with the appended drawings is intended as a description of some example embodiments of a system for a continuous time linear equalization (CTLE) feedback for tunable direct current (DC) gain and mid-band correction provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

In some embodiments, one or more outputs of the different embodiments of the methods and systems of the present disclosure may be transmitted to an electronics device coupled to or having a display device for displaying the one or more outputs or information regarding the one or more outputs of the different embodiments of the methods and systems of the present disclosure.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

High speed serial links, often referred to as serialzier/deserializer (SerDes), are used extensively as interfaces in electronic devices such as electronic displays. As increasing amounts of data are transmitted over such high-speed serial links (e.g., as result of increased display resolution, color depth, and/or refresh rates), the interface speed increases accordingly as well. With the increase in speed comes an increase in power and silicon area of a communication receiver of the interface. A high-speed SerDes may encounter many challenges with respect to high-speed operation, equalization methods, power consumption, area, etc. For example, for the SerDes applications with several hundreds of lanes integrated in an integrated circuit (IC), the power consumption may be an important factor in maintaining high performance.

High speed digital (HSD) ICs may be used in SerDes circuits defined at a high data rate with a lossy channel between the transmitter and the receiver. The received data in such SerDes circuits may be distorted and may needed to be reconstructed (e.g., equalized) before use.

Decision feedback equalizer (DFE) circuits may be used in high speed wireless data communication systems for purposes of signal recovery distorted during propagation through lossy and dispersive channels.

For example, FIG. 1 illustrates a simple block diagram of a high speed communication system. The communication system of FIG. 1 includes a transmitter 10, a receiver 20, and a channel 30 for data communication between the transmitter 10 and the receiver 20. The receiver 20 includes an analog front end 21, a DFE 22, and receiver logic 23.

An analog front end (AFE) (e.g., AFE 21) circuit may be a single-stage circuit and incorporates both the variable gain adjustment (VGA) and linear equalizer (LEQ) functions in it. The buffer in the AFE drives the DFE (e.g., DFE 22) input stages and the buffer output is controlled by common mode feedback to control the common mode for the DFE input stage. The AFE may play an important role not only in equalization, but also in the robustness and power. This may be achieved by a simple and minimum stage of construction. In case of a high-speed application (e.g., 28 Gbps or above), increasing the bias current with a differential pair circuit may not be useful after certain optimum bias because the output impedance of the differential pair may degrade by increasing the bias current. Therefore, even though the transconductance of the differential pair will improve with higher current, the AFE may not achieve sufficient gain. It also degrades the bandwidth because the large device size is needed at the low-power supply voltage.

A high-speed transimpedance amplifier (TIA) circuit may be desirable in high-speed applications to improve the high frequency bandwidth. One or more embodiments of the present disclosure includes a single-stage TIA-based LEQ with feedback. The AFE may drive the DFE input stages where there are several data and error DFE slicer circuits connected. The TIA decouples the heavy loading capacitance and improves the high-frequency response.

Figure 2:
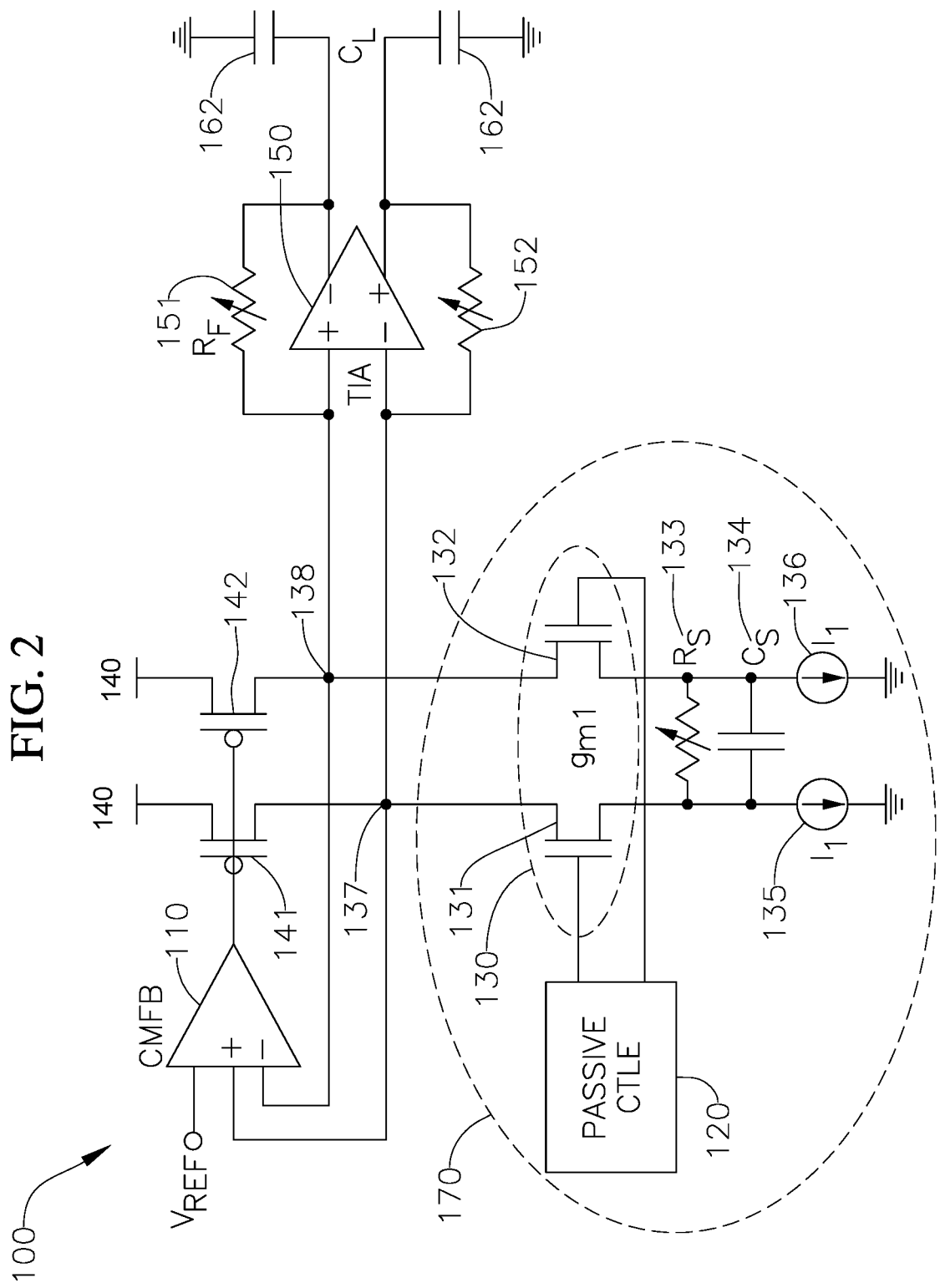
FIG. 2 illustrates a transimpedance amplifier (TIA) based analog front end (AFE) circuit.

FIG. 2 illustrates a TIA based AFE circuit. For example, FIG. 2 illustrates a TIA based AFE circuit 100. The AFE circuit of FIG. 2 includes a common-mode feedback (CMFB) circuit 110, a passive continuous time linear equalizer (CTLE) circuit 120, an input stage differential pair 130 including two n-type metal oxide semiconductor (NMOS) transistors 131 and 132, a degeneration resistor $R_s$ 133 (e.g., a variable resistor or a tunable resistor) and a degeneration capacitor $C_s$ 134, two current sources 135 and 136, two PMOS transistors 141 and 142, a high-speed transimpedance amplifier (TIA) 150, two variable (or tunable) feedback resistors $R_F$ 151 and 152, and two capacitors $C_L$ 161 and 162.

In one or more embodiments, the differential pair 130, the passive CTLE circuit 120, the degeneration resistor $R_s$ 133 (e.g., a variable resistor), the degeneration capacitor $C_s$ 134, the first current source 135, and the second current source 136 may together be referred as a CTLE circuit 170.

A CTLE circuit may be used to equalize the data received at the receiver end of a SerDes circuit. CTLE is a linear filter that may be located at the receiver for attenuating low-frequency signal components, amplify components around the Nyquist frequency, and filter off higher frequencies. CTLE gain may be adjusted to optimize the ratio of low frequency attenuation to high frequency amplification.

Two input terminals of the CMFB circuit 110 may be connected to two output terminals 137 and 138 of the CTLE circuit 170. A third input terminal of the CMFB circuit 110 may receive a reference voltage $V_{REF}$. In one or more embodiments, in order to keep the inverter circuit in the TIA 150 to be biased properly over the process, voltage, and temperature (PVT), the reference voltage $V_{REF}$ for CMFB circuit 110 may be generated by a replica bias block. In one or more embodiments, the replica bias block may be a half circuit of the TIA 150, and the input and the output may be shorted to generate the reference bias voltage to be optimum over the PVT variation. In one or more embodiments, the replica bias block may include a PMOS transistor and an NMOS transistor connected in series between a power supply a current source. The current source may be further connected to the ground. For example, the PMOS transistor may be connected between the power supply and a first electrode of the NMOS transistor and the NMOS transistor may be connected between a second electrode of the PMOS transistor and the current source. The current source may be connected between a second electrode of the NMOS transistor and the ground. The gate electrodes of the PMOS transistor and the NMOS transistors are connected together. In the replica bias block, the input and output may be shorted.

The output terminal of the CMFB circuit 110 may be connected at the gate terminal of two PMOS transistors 141 and 142. The transistors 141 and 142 may be connected between a power supply 140 and the output terminals 137 and 138 of the CTLE circuit 170. For example, the PMOS transistor 141 may be connected between a power supply 140 and a first output terminal 137 of the CTLE circuit 170 and the PMOS transistor 142 may be connected between the power supply 140 and a second output terminal 138 of the CTLE circuit 170.

The differential pair 130 includes a first NMOS transistor 131 and a second NMOS transistor 132. A first terminal of the first NMOS transistor 131 may be connected to the first output terminal 137 of the CTLE circuit 170 and a second terminal of the first NMOS transistor 131 may be connected to a first current source 135. A first terminal of the second NMOS transistor 132 may be connected to the second output terminal 138 of the CTLE circuit 170 and a second terminal of the second NMOS transistor 132 may be connected to a second current source 136. The gate terminals of the transistors 131 and 132 of the differential pair 130 may be connected to output terminals of the passive CTLE circuit 120. In one or more embodiments, $g_{m1}$ represents transconductance of the input stage differential pair 130.

The degeneration resistor $R_s$ 133 (e.g., a variable resistor or a tunable resistor) and the degeneration capacitor $C_s$ 134 may be connected between the second terminals of the transistors 131 and 132 of the differential pair 130. In one or more embodiments, the gain and the boost of the AFE circuit 100 may be controlled by tuning the degeneration resistor $R_s$ 133 and the degeneration capacitor $C_s$ 134.

The first current source 135 may be connected between the second terminal of the first NMOS transistor 131 and the ground, and the second current source 136 may be connected between the second terminal of the second NMOS transistor 132 and the ground.

The output current from the differential pair 130 is fed to the TIA 150. For example, a first input terminal (e.g., the non-inverting input terminal) of the TIA 150 may be connected to the second output terminal 138 of the CTLE circuit 170 and a second input terminal (e.g., the inverting input terminal) of the TIA 150 may be connected to the first output terminal 137 of the CTLE circuit 170. A first variable feedback resistor $R_F$ 151 may be connected between the first input terminal (e.g., the non-inverting input terminal) and a first output terminal (e.g., inverting output terminal) of the TIA 150 and a second variable feedback resistor $R_F$ 152 may be connected between the second input terminal (e.g., the inverting input terminal) and a second output terminal (e.g., non-inverting output terminal) of the TIA 150. A first capacitor $C_L$ 161 may be connected between the first output terminal (e.g., inverting output terminal) of the TIA 150 and the ground, and a second capacitor $C_L$ 162 may be connected between the second output terminal (e.g., non-inverting output terminal) of the TIA 150 and the ground. In one or more embodiments, the TIA 150 may be configured by single stage inverter based circuit and a tail current source to maintain the DC bias.

TIA-based topology decouples heavy loading capacitance from succeeding blocks (e.g., slicers or DFE), thus improving high-frequency response, and incorporates both linear equalization (LEQ) and variable gain amplification (VGA) functions.

In one or more embodiments, the degeneration resistor $R_s$ 133 may adjust the low frequency DC gain of the TIA based AFE circuit 100. The first and second variable feedback resistors $R_F$ 151 and 152 of the TIA 150 may implement the VGA function (e.g., identical gain change over all frequencies).

Figure 3A:
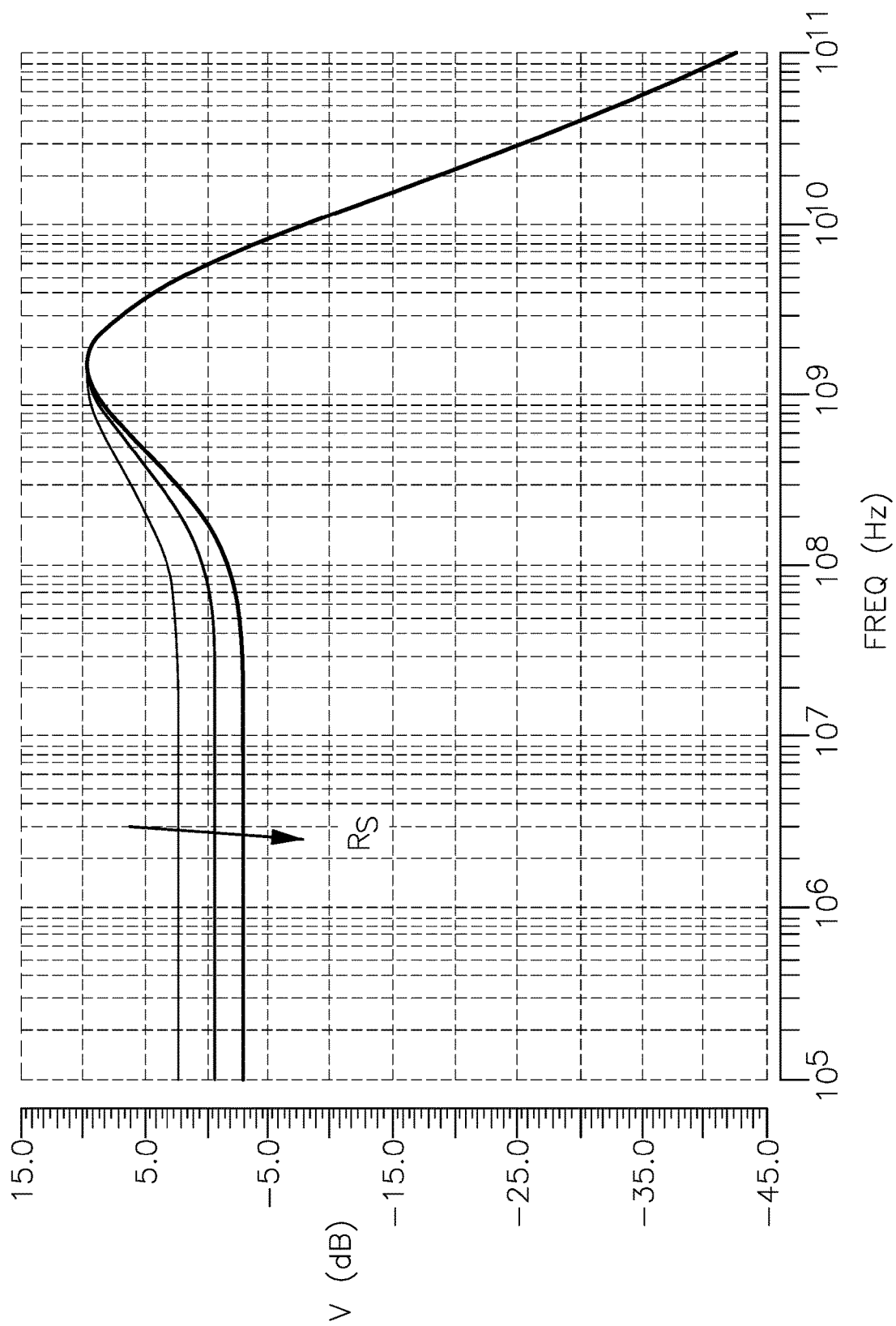
FIGS. 3A-3B illustrate frequency response of the TIA based AFE circuit of FIG. 2.
Figure 3B:
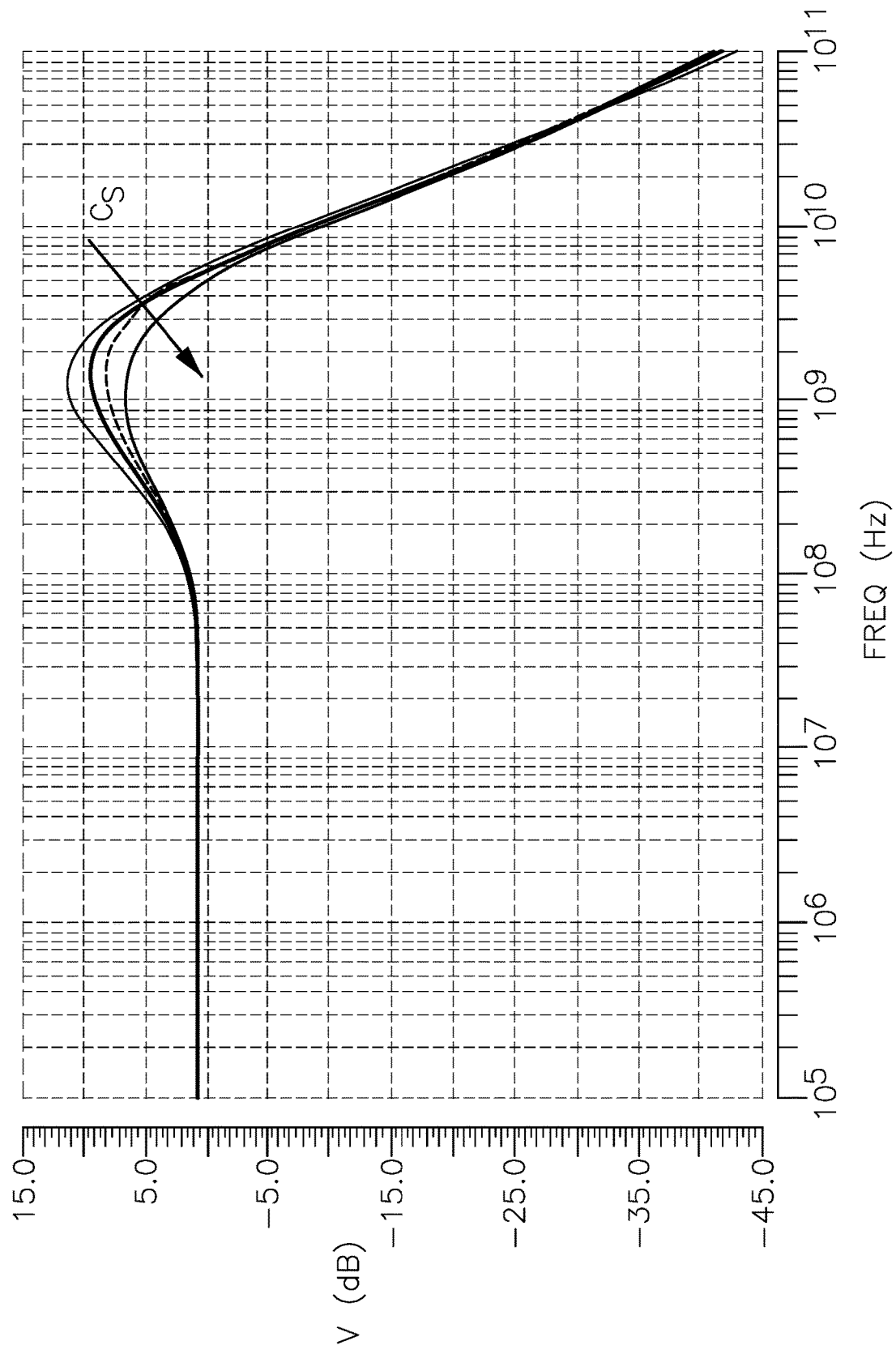

FIGS. 3A-3B illustrate frequency response of the TIA based AFE circuit 100 of FIG. 2.

For example, as shown in FIG. 3A, in one or more embodiments, the degeneration resistor $R_S$ 133 may adjust the DC gain of the AFE circuit 100. For example, in one or more embodiments, the degeneration resistor $R_S$ 133 may change zero location in the frequency response.

For example, in one or more embodiments, the zero frequency may be represented as: $\omega_z = 1/R_S \cdot C_S$; where $R_S$ is the value of degeneration resistor and $C_S$ is the value of degeneration capacitor. Because the degeneration resistor $R_S$ 133 is a variable resistor, by adjusting the value of the degeneration resistor $R_S$ 133, the location of zero in a frequency response of the AFE circuit 100 may be changed.

Further, as shown in FIG. 3B, in one or more embodiments, the high frequency gain (e.g., maximum peaking) of the AFE circuit 100 may be adjusted by adjusting a variable degeneration capacitor $C_S$. However, such adjustments in the high frequency gain may change high frequency response as well.

For example, in one or more embodiments, the pole frequency may be represented as: $\omega_p = g_{m1}/C_S$; where $C_S$ is the value of degeneration capacitor and $g_{m1}$ represents transconductance of the input stage differential pair 130. In a case where the degeneration capacitor $C_S$ is a variable capacitor, the pole frequency may be adjusted by adjusting the value of the degeneration capacitor $C_S$. By making the transconductance of the TIA 150 high, the pole frequency moves higher and the Q factor becomes high, which in turn improves the high-frequency behavior.

In one or more embodiments, a pole frequency may correspond to a corner frequency at which the slope of the magnitude curve decreases by 20 dB/decade, and a zero corresponds to a corner frequency at which the slope increases by 20 dB/decade.

However, the TIA based AFE circuit 100 of FIG. 2 may not allow for mid-band gain adjustment.

Figure 4:
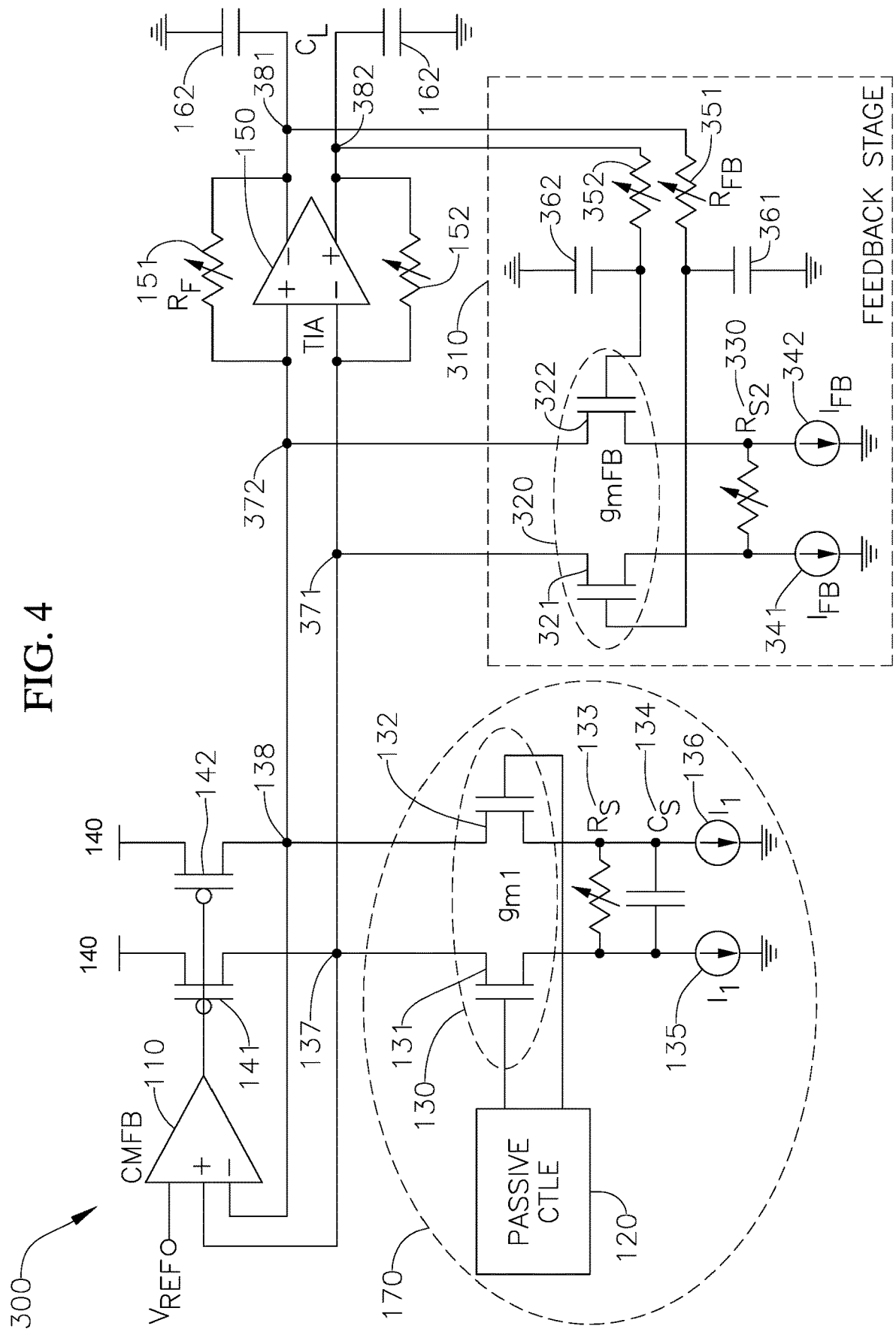
FIG. 4 illustrates a TIA based AFE circuit with feedback.

FIG. 4 illustrates a TIA based AFE circuit with feedback. For example, FIG. 4 illustrates a TIA based AFE circuit where a feedback circuit 310 is introduced in the AFE circuit 100 of FIG. 2 to allow increased CTLE control for various types of channels and to change mid-band response by zero-location adjustment, while keeping high frequency region of operation unchanged.

For example, in the embodiment of FIG. 4, a feedback circuit (or a feedback stage) 310 is connected between the input terminals of the TIA 150 and the output terminals of the TIA 150.

For example, input terminals 381 and 382 of the feedback circuit 310 may be connected to the first and second output terminals of the TIA 150, respectively. For example, the first input terminal 381 of the feedback circuit 310 may be connected to the first output terminal (e.g., the inverting output terminal) of the TIA 150 and the second input terminal 382 of the feedback circuit 310 may be connected to the second output terminal (e.g., non-inverting output terminal) of the TIA 150. A first output terminal 371 of the feedback circuit 310 may be connected to the second input terminal (e.g., the inverting input terminal) of the TIA 150 and the first output terminal 137 of the CTLE circuit 170. A second output terminal 372 of the feedback circuit 310 may be connected to the first input terminal (e.g., the non-inverting input terminal) of the TIA 150 and the second output terminal 138 of the CTLE circuit 170.

The feedback circuit 310 includes a feedback differential pair 320, a feedback degeneration variable resistor $R_{S2}$ 330 (e.g., a tunable resistor), a first feedback current source $I_{FB}$ 341, a second feedback current source $I_{FB}$ 342, a first feedback variable resistor $R_{FB}$ 351 (e.g., a tunable resistor), a second feedback variable resistor $R_{FB}$ 352 (e.g., a tunable resistor), a first feedback capacitor $C_{FB}$ 361, and a second feedback capacitor $C_{FB}$ 362.

The feedback differential pair 320 includes a third NMOS transistor 321 and a fourth NMOS transistor 322. A first terminal of the third NMOS transistor 321 may be connected to the first output terminal 371 of the feedback circuit 310 and a second terminal of the third NMOS transistor 321 may be connected to the first feedback current source $I_{FB}$ 341. A gate terminal of the third NMOS transistor 321 may be connected to the first input terminal 381 of the feedback circuit 310, which is connected to the first output terminal (e.g., the inverting output terminal) of the TIA 150. The gate terminal of the third NMOS transistor 321 of the feedback circuit 310 may be connected to the first input terminal 381 of the feedback circuit 310 via the first feedback variable resistor $R_{FB}$ 351. For example, the first feedback variable resistor $R_{FB}$ 351 may be connected between the gate terminal of the third NMOS transistor 321 and the first input terminal 381 of the feedback circuit 310. In one or more embodiments, the value of the feedback variable resistor $R_{FB}$ (e.g., 351 and 352) may be 500 ohm to 4K ohm.

A first terminal of the fourth NMOS transistor 322 may be connected to the second output terminal 372 of the feedback circuit 310 and a second terminal of the fourth NMOS transistor 322 may be connected to the second feedback current source $I_{FB}$ 342. A gate terminal of the fourth NMOS transistor 322 may be connected to the second input terminal 382 of the feedback circuit 310, which is connected to the second output terminal (e.g., the non-inverting output terminal) of the TIA 150. The gate terminal of the fourth NMOS transistor 322 may be connected to the second input terminal 382 of the feedback circuit 310 via the second feedback variable resistor $R_{FB}$ 352. For example, the second feedback variable resistor $R_{FB}$ 352 may be connected between the gate terminal of the fourth NMOS transistor 322 and the second input terminal 382 of the feedback circuit 310.

In one or more embodiments, $g_{mFB}$ represents transconductance of the feedback differential pair 320.

The first feedback capacitor $C_{FB}$ 361 may be connected between the gate terminal of the third NMOS transistor 321 and the ground and the second feedback capacitor $C_{FB}$ 362 may be connected between the gate terminal of the fourth NMOS transistor 322 and the ground.

The feedback degeneration variable resistor $R_{S2}$ 330 may be connected between the second terminals of the transistors 321 and 322 of the feedback differential pair 320. In one or more embodiments, the value of the feedback degeneration variable resistor $R_{S2}$ 330 may be 500 ohm to 3K ohm.

The first feedback current source $I_{FB}$ 341 may be connected between the second terminal of the third NMOS transistor 321 and the ground, and the second feedback current source $I_{FB}$ 342 may be connected between the second terminal of the fourth NMOS transistor 322 and the ground.

The feedback differential pair 320 of the feedback circuit receives gate bias from the output terminals of the TIA 150 via the first and second feedback variable resistors $R_{FB}$ 351 and 352, and the output current from the feedback differential pair 320 is fed to the TIA 150 input terminals via the output terminals 371 and 372 of the feedback circuit 310.

The feedback circuit 310 of FIG. 4 may also be referred as a CTLE feedback circuit (or stage).

Figure 5A:
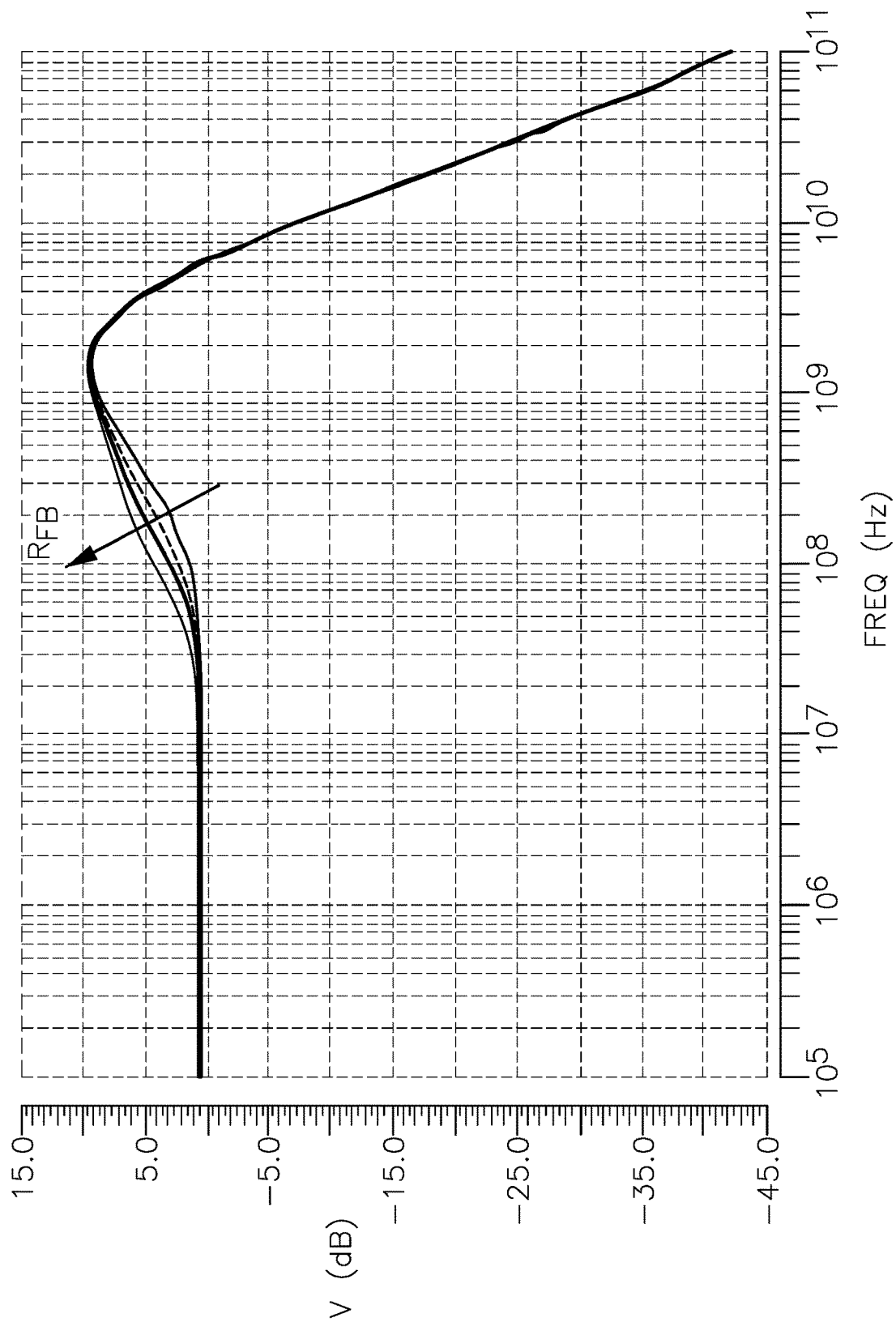
FIGS. 5A-5B illustrate frequency response of the TIA based AFE circuit with feedback of FIG. 4.
Figure 5B:
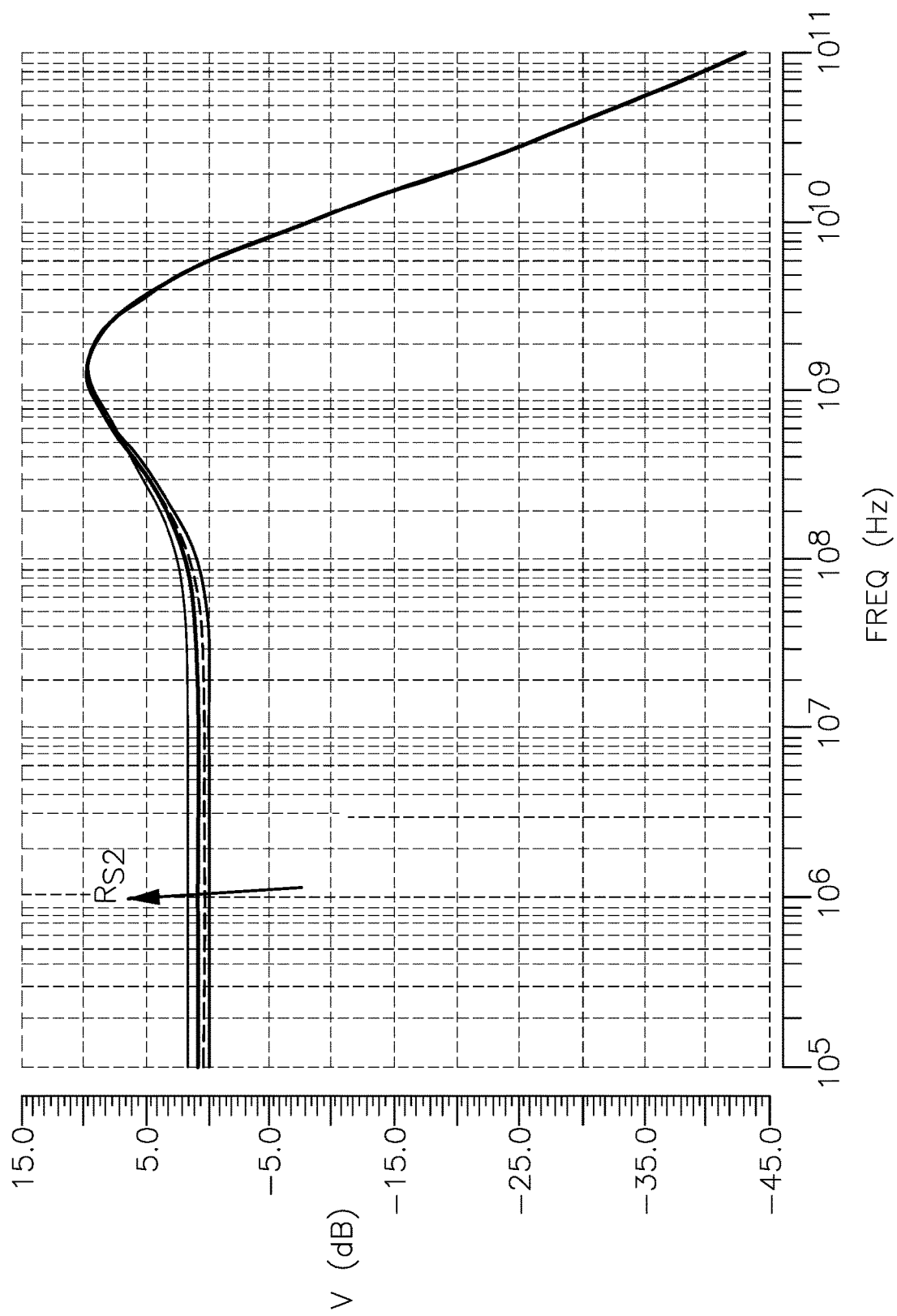

FIGS. 5A-5B illustrate frequency response of the TIA based AFE circuit with feedback 300 of FIG. 4.

The TIA based AFE circuit with feedback 300 may maintain all beneficial features of the TIA based AFE circuit 100 of FIG. 2, while providing additional unique controls for various types of channels. For example, the variable feedback resistor $R_{FB}$ (e.g. 351 and 352), when used as a control knob, may allow for a wideband frequency equalization. For example, in one or more embodiments, as shown in FIG. 5A, by adjusting the value of the variable feedback resistor $R_{FB}$ (e.g. 351 and 352), the mid-band frequency response of the TIA based AFE circuit with feedback 300 may be changed (or adjusted) by zero-location adjustment, while keeping high frequency region of operation unchanged.

Also, beside the first degeneration resistor $R_S$ 133 that controls the DC gain, as shown in FIG. 5B, the feedback degeneration variable resistor $R_{S2}$ 330 may also be used for DC gain tuning of the TIA based AFE circuit with feedback 300, while maintaining high frequency response unchanged.

In one or more embodiments, addition of the feedback circuit 310 to the TIA based AFE circuit 300 keeps all useful features of the conventional CTLE, as well as provides two key extra controlling knobs (e.g., the feedback degeneration variable resistor $R_{S2}$ 330 and the variable feedback resistor $R_{FB}$ 351 and 352) for mid-band frequency response correction and DC gain fine tuning of the TIA based AFE circuit with feedback 300, thus increasing CTLE control for various types of channels with minor power/area overhead.

As shown in FIG. 4, the feedback circuit 310 of the TIA based AFE circuit 300 includes a low-pass RC filter including the variable feedback resistor $R_{FB}$ (e.g., 351 and 352) and the feedback capacitor $C_{FB}$ (e.g., 361 and 362), and a current mode logic (CML) gain circuit including the feedback differential pair 320 and the feedback degeneration variable resistor $R_{S2}$ 330. At low frequencies, the feedback circuit 310 operates like the broadband amplifier. At high frequencies, the transconductance $g_{m1}$ of the input stage differential pair 130 in forward path overwhelms the feedback from the much weaker transconductance $g_{mFB}$ of the feedback differential pair 320, and the high-frequency gain approaches the gain of forward path including TIA 150. In one or more embodiments, the low-pass RC filter including the variable feedback resistor $R_{FB}$ (e.g., 351 and 352) and the feedback capacitor $C_{FB}$ (e.g., 361 and 362) reduces the feedback factor at high frequencies, further enhancing maximum peaking. The CML gain stage including the feedback differential pair 320 and the feedback degeneration variable resistor $R_{S2}$ 330 ($g_{mFB}$) incurs minor power and area overhead as $g_{mFB} < g_{m1}/5$.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. An analog front end (AFE) circuit comprising:
  a continuous time linear equalizer (CTLE) circuit;
  a transimpedance amplifier (TIA) connected to the CTLE circuit; and
  a feedback circuit comprising:
    a first transistor connected between a first output of the feedback circuit and a first node connected to a first current source;
    a second transistor connected between a second output of the feedback circuit and a second node connected to a second current source; and
    a first tunable resistor coupled between the first node and the second node, wherein:
    a first input of the feedback circuit is connected to a first output of the TIA;
    a second input of the feedback circuit is connected to a second output of the TIA;
    the second output of the feedback circuit is connected to a first input of the TIA; and
    the first output of the feedback circuit is connected to a second input of the TIA,
  wherein the first input of the feedback circuit is connected to a gate terminal of the first transistor through a second tunable resistor.

2. The AFE circuit of claim 1, wherein:
  the second input of the feedback circuit is connected to a gate terminal of the second transistor through a third tunable resistor;

the first current source is connected between the first node and a ground; and the second current source is connected between the second node and the ground.

3. The AFE circuit of claim 2, wherein the feedback circuit further comprises:
a first capacitor connected between the gate terminal of the first transistor and the ground; and
a second capacitor connected between the gate terminal of the second transistor and the ground,
wherein the second tunable resistor, the third tunable resistor, the first capacitor, and the second capacitor are configured to reduce a feedback factor of the AFE circuit at high frequencies to enhance maximum peaking.

4. The AFE circuit of claim 2, wherein the first tunable resistor is between 500 ohm to 3K ohm, and the second tunable resistor and the third tunable resistor is between 500 ohm to 4K ohm.

5. The AFE circuit of claim 2, wherein the second tunable resistor and the third tunable resistor are configured to equalize wideband frequency response of the AFE circuit.

6. The AFE circuit of claim 2, wherein the second tunable resistor and the third tunable resistor are configured to adjust mid-band frequency response of the AFE circuit by adjusting zero-location in a frequency response of the AFE circuit.

7. The AFE circuit of claim 2, wherein the first tunable resistor is configured to adjust DC gain of the AFE circuit.

8. The AFE circuit of claim 1, wherein:
the second input of the TIA is connected to a first output of the CTLE circuit;
the first input of the TIA is connected to a second output of the CTLE circuit;
the first output of the TIA is connected to the first input of the TIA through a fourth tunable resistor; and
the second output of the TIA is connected to the second input of the TIA through a fifth tunable resistor.

9. The AFE circuit of claim 8, wherein:
the fourth tunable resistor and the fifth tunable resistor are configured to implement identical gain change over all frequencies;
a third capacitor is connected between the first output of the TIA and a ground; and
a fourth capacitor is connected between the second output of the TIA and the ground.

10. The AFE circuit of claim 1, wherein the CTLE circuit comprises:
a third transistor connected between a first output of the CTLE circuit and a third node connected to a third current source;
a fourth transistor connected between a second output of the CTLE circuit and a fourth node connected to a fourth current source;
a tunable degeneration resistor coupled between the third node and the fourth node;
a degeneration capacitor coupled between the third node and the fourth node, wherein:
a gate terminal of the third transistor and a gate terminal of the fourth transistor are connected to a passive CTLE circuit;
the first output of the CTLE circuit is connected to the first output of the feedback circuit and the second input of the TIA; and
the second output of the CTLE circuit is connected to the second output of the feedback circuit and the first input of the TIA.

11. The AFE circuit of claim 10, wherein:
the third current source is connected between the third node and a ground; and
the fourth current source is connected between the fourth node and the ground.

12. The AFE circuit of claim 10, wherein gain and boost of the AFE circuit is controlled by tuning the tunable degeneration resistor and the degeneration capacitor.

13. The AFE circuit of claim 10, wherein the tunable degeneration resistor is configured to adjust low frequency DC gain of the AFE circuit by adjusting zero-location in a frequency response of the AFE circuit, and
wherein the degeneration capacitor is configured to adjust high frequency gain of the AFE circuit.

14. The AFE circuit of claim 10, further comprising:
a fifth transistor connected between a power supply and the first output of the CTLE circuit;
a sixth transistor connected between the power supply and the second output of the CTLE circuit; and
a common-mode feedback (CMFB) circuit connected to gate terminals of the fifth transistor and the sixth transistor, wherein:
an output terminal of the CMFB circuit is connected to the gate terminals of the fifth transistor and the sixth transistor,
a first input terminal of the CMFB circuit is connected to the first output of the CTLE circuit;
a second input terminal of the CMFB circuit is connected to the second output of the CTLE circuit; and
a third input terminal of the CMFB circuit is connected to a reference voltage.

15. An analog front end (AFE) circuit comprising:
a transimpedance amplifier (TIA); and
a feedback circuit comprising:
a first transistor connected between a first output of the feedback circuit and a first node connected to a first current source;
a second transistor connected between a second output of the feedback circuit and a second node connected to a second current source; and
a first tunable resistor coupled between the first node and the second node, wherein:
a first input of the feedback circuit is connected to a first output of the TIA;
a second input of the feedback circuit is connected to a second output of the TIA;
the second output of the feedback circuit is connected to a first input of the TIA;
the first output of the feedback circuit is connected to a second input of the TIA;
the first input of the feedback circuit is connected to a gate terminal of the first transistor through a second tunable resistor;
the second input of the feedback circuit is connected to a gate terminal of the second transistor through a third tunable resistor;
the first output of the TIA is connected to the first input of the TIA through a fourth tunable resistor; and
the second output of the TIA is connected to the second input of the TIA through a fifth tunable resistor.

16. The AFE circuit of claim 15, wherein the feedback circuit further comprises:
a first capacitor connected between the gate terminal of the first transistor and the ground; and
a second capacitor connected between the gate terminal of the second transistor and the ground, wherein:
the first current source is connected between the first node and a ground;

the second current source is connected between the second node and the ground; and the second tunable resistor, the third tunable resistor, the first capacitor, and the second capacitor are configured to reduce a feedback factor of the AFE circuit at high frequencies to enhance maximum peaking.

17. The AFE circuit of claim 16, further comprises a continuous time linear equalizer (CTLE) circuit comprising:
a third transistor connected between a first output of the CTLE circuit and a third node connected to a third current source;
a fourth transistor connected between a second output of the CTLE circuit and a fourth node connected to a fourth current source;
a tunable degeneration resistor coupled between the third node and the fourth node;
a degeneration capacitor coupled between the third node and the fourth node, wherein:
a gate terminal of the third transistor and a gate terminal of the fourth transistor are connected to a passive CTLE circuit;
the first output of the CTLE circuit is connected to the first output of the feedback circuit and the second input of the TIA;
the second output of the CTLE circuit is connected to the second output of the feedback circuit and the first input of the TIA;
the third current source is connected between the third node and a ground; and
the fourth current source is connected between the fourth node and the ground.

18. The AFE circuit of claim 17, wherein:
the second input of the TIA is connected to the first output of the CTLE circuit;
the first input of the TIA is connected to the second output of the CTLE circuit;
a third capacitor is connected between the first output of the TIA and a ground; and
a fourth capacitor is connected between the second output of the TIA and the ground.

19. The AFE circuit of claim 17, further comprising:
a fifth transistor connected between a power supply and the first output of the CTLE circuit;
a sixth transistor connected between the power supply and the second output of the CTLE circuit; and
a common-mode feedback (CMFB) circuit connected to gate terminals of the fifth transistor and the sixth transistor, wherein:
an output terminal of the CMFB circuit is connected to the gate terminals of the fifth transistor and the sixth transistor,
a first input terminal of the CMFB circuit is connected to the first output of the CTLE circuit;
a second input terminal of the CMFB circuit is connected to the second output of the CTLE circuit; and
a third input terminal of the CMFB circuit is connected to a reference voltage.

20. A system comprising:
a continuous time linear equalizer (CTLE) circuit;
a transimpedance amplifier (TIA) connected at an output of the CTLE circuit; and
a feedback circuit comprising:
a first transistor connected between a first output of the feedback circuit and a first node connected to a first current source;
a second transistor connected between a second output of the feedback circuit and a second node connected to a second current source; and
a first tunable resistor coupled between the first node and the second node, wherein:
a first input of the feedback circuit is connected to a first output of the TIA;
a second input of the feedback circuit is connected to a second output of the TIA;
the second output of the feedback circuit is connected to a first input of the TIA;
the first output of the feedback circuit is connected to a second input of the TIA;
the first input of the feedback circuit is connected to a gate terminal of the first transistor through a second tunable resistor; and
the second input of the feedback circuit is connected to a gate terminal of the second transistor through a third tunable resistor.

* * * * *